(12) United States Patent
Lin

(10) Patent No.: US 10,047,264 B2
(45) Date of Patent: Aug. 14, 2018

(54) POLYMER COMPOSITE THERMAL INTERFACE MATERIAL WITH HIGH THERMAL CONDUCTIVITY

(71) Applicant: International Business Machines Corporation, Armonk, NY (US)

(72) Inventor: Wei Lin, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 537 days.

(21) Appl. No.: 14/546,394

(22) Filed: Nov. 18, 2014

(65) Prior Publication Data
US 2016/0137900 A1     May 19, 2016

(51) Int. Cl.
| | |
|---|---|
| C09K 5/14 | (2006.01) |
| C08G 18/42 | (2006.01) |
| C08G 18/32 | (2006.01) |
| C08G 18/20 | (2006.01) |
| C08G 18/76 | (2006.01) |
| C08G 18/66 | (2006.01) |
| C09J 175/06 | (2006.01) |
| C08G 18/00 | (2006.01) |

(52) U.S. Cl.
CPC .............. C09K 5/14 (2013.01); C08G 18/003 (2013.01); C08G 18/2027 (2013.01); C08G 18/3206 (2013.01); C08G 18/4277 (2013.01); C08G 18/6644 (2013.01); C08G 18/7671 (2013.01); C09J 175/06 (2013.01); *C08G 2270/00* (2013.01)

(58) Field of Classification Search
None
See application file for complete search history.

(56) References Cited

U.S. PATENT DOCUMENTS

| | | |
|---|---|---|
| 4,088,626 A | 5/1978 | Gergen et al. |
| 4,302,553 A | 11/1981 | Frisch et al. |
| 4,557,857 A | 12/1985 | Sorensen |
| 6,835,453 B2 | 12/2004 | Greenwood et al. |
| 7,312,261 B2 | 12/2007 | Sachdev et al. |
| 7,527,090 B2 | 5/2009 | Dani et al. |
| 7,723,430 B2 | 5/2010 | Kunitake et al. |
| 8,003,216 B2 | 8/2011 | Wang et al. |
| 8,344,053 B2 | 1/2013 | Xu et al. |
| 8,652,641 B2 | 2/2014 | Wang et al. |
| 2003/0119987 A1* | 6/2003 | Eadara ............... C08G 59/50 525/107 |
| 2003/0207064 A1 | 11/2003 | Bunyan et al. |
| 2005/0277351 A1* | 12/2005 | Smith ................ C08K 3/14 442/110 |
| 2008/0073623 A1 | 3/2008 | Wang et al. |
| 2011/0214852 A1* | 9/2011 | Wang ................ C09K 5/00 165/185 |
| 2013/0062045 A1 | 3/2013 | Chu et al. |
| 2013/0187748 A1 | 7/2013 | Sha et al. |
| 2014/0374649 A1* | 12/2014 | Chen .................. C08K 3/28 252/75 |

FOREIGN PATENT DOCUMENTS

| | | |
|---|---|---|
| CA | 2474740 C | 10/2011 |
| CN | 1696231 B | 5/2010 |
| JP | H05295133 A | 11/1993 |
| WO | 97/41599 A1 | 11/1997 |
| WO | 0036893 A2 | 6/2000 |
| WO | 2013/020106 A1 | 2/2013 |
| WO | 2013/074415 A1 | 5/2013 |

OTHER PUBLICATIONS

Klempner et al., "Polyurethane Interpenetrating Polymer Networks. I. Synthese and Morphology of Polyurethane-Poly(methyl methylacrylate) Interpenetrating Polymer Networks" Macromolecules, vol. 9, No. 2, pp. 258-263 (1975).*
Chen and Ju et al., "Permeation of Oxygen through Polyurethane-Polyepoxide Interpenetrating Polymer Networks," Journal of Applied Polymer Science, vol. 25, pp. 1105-1116 (1980).*
Nguyen et al., "TIM1 Relaibility of Polymer Solder", Henkel Electronic Materials LLC, Irvine, CA, 13th IEEE ITHERM Conference 2012 IEEE, pp. 1250-1254.
Kim et al, "Polyurethane Interpenetrating Polymer Networks. I. Synthesis and Morphology of Polyurethane-Poly (methyl methacrylate) Interpenetrating Polymer Networks", Synthesis and Morphology of Polyurethane Networks, vol. 9, No. 2, Mar.-Apr. 1976, pp. 258-263.
Patent Cooperation Treaty, Notification of Transmittal of the International Search Report and the Written Opinion of the International Searching Authority, or the Declaration, dated Dec. 15, 2015, 6 pages.

* cited by examiner

*Primary Examiner* — Randy P Gulakowski
*Assistant Examiner* — Ha S Nguyen
(74) *Attorney, Agent, or Firm* — Steven J. Meyers; Hoffman Warnick LLC

(57) ABSTRACT

The present invention relates generally to thermally conductive adhesives for thermal interfaces in electronic packaging, and more particularly, to a polymer-based composite thermal interface material ("TIM") with an inter-penetrating network (IPN) polymer matrix consisting of polyurethane and an epoxy that is fully crosslinked. The IPN polymer matrix is designed to improve overall thermal conductivity by the altering the dispersion/distribution of thermally conductive fillers, the filler/polymer interfaces, and/or phonon scattering behaviors in the composite.

11 Claims, No Drawings

POLYMER COMPOSITE THERMAL INTERFACE MATERIAL WITH HIGH THERMAL CONDUCTIVITY

BACKGROUND

The present invention relates generally to thermally conductive adhesives for thermal interfaces in electronic packaging, and more particularly, to a polymer-based composite thermal interface material ("TIM") with an inter-penetrating network (IPN) polymer matrix backbone designed to improve thermal conductivity.

The rapid technology advancements in high performance electronics packaging has focused on reduced size and higher operating speed. This has resulted in excessive heat generation during device operation. There is an accompanying need for effective heat dissipation methods to maintain the reliable functional performance of electronic assembly products. Commonly used methods of cooling include helium filled modules, solder thermal interfaces, thermal greases, elastomeric silicone gels, and thermoplastic polymers with thermally conductive fillers such as AlN, BN, or ZnO. These provide the thermal interface between two structures, such as a flip-chip, chip-on-chip, or package-on-package, to allow a path for heat dissipation from the high power density circuit devices during operation.

SUMMARY

According to an embodiment, a thermal interface material ("TIM") is disclosed. The TIM may include: a polymer based composite comprising an inter-penetrating network (IPN) matrix structure; and thermally conductive filler particles dispersed throughout the IPN matrix.

According to another embodiment, a method of forming a TIM is disclosed. The method may include: forming a polyurethane prepolymer; forming an epoxy prepolymer; mixing the polyurethane prepolymer and the epoxy prepolymer to form a crosslinked inter-penetrating network (IPN); and adding a thermally conductive filler.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to thermally conductive adhesives for thermal interfaces in electronic packaging, and more particularly, to a polymer-based composite thermal interface material ("TIM") with an inter-penetrating network (IPN) polymer matrix backbone designed to improve thermal conductivity and a method of forming said TIM.

Conventional TIMs are typically composed of a polymer composite material filled with pores or thermally conductive fillers, such as ceramics, metals, semiconductors, or carbon nanotubes that dissipate heat. Typically, the overall thermal conductivity of a TIM is optimized by adjusting the type of thermally conductive filler used along with the parameters of the filler/fillers chosen, such as particle size and size distribution, volume fraction (i.e., "filler loading"), particle shape, topology, special distribution, etc.

In addition, the overall thermal conductivity of a TIM may be improved by using a polymer that itself has a very high thermal conductivity (e.g., 0.5 W/mK and larger) in conjunction with the thermally conductive fillers. However, this method requires specific polymer precursors (i.e., a thermosetting plastic and a thermosetting epoxy resin) that, when, combined, have a thermal conductivity that may be higher than conventional polymers used in TIM applications. One example of such a TIM with a polymer having a high thermal conductivity uses a pseudo inter-penetrating network ("PIPN") in which only one component, the epoxy resin, is cross-linked while the other component, the plastic, remains linear. PIPNs are distinguished from full IPNs because the constituent linear or branched polymers can, in principle, be separated from the constituent polymer network(s) without breaking chemical bonds. In other words, PIPNs are polymer blends rather than a fully cross-linked IPN matrix.

Embodiments of the present invention include a TIM having a true IPN matrix backbone that may provide improved overall thermal conductivity, using conventional fillers, due to the polymer physics of the IPN matrix itself. The flexibility of the IPN matrix, as compared to conventional poylmers, may influence the dispersion/distribution of the fillers, the filler/polymer interfaces, and/or phonon scattering behaviors in the composite.

IPNs can be classified as polymeric catenanes, or a cross-linked polymer network composed of many macrocycles of varying sizes. IPNs may be formed when a cyclization (cross-linking) of one component occurs in the presence of the other already cyclized component to form the cross-linked polymer network. Typically, IPNs involve heterogeneous systems, usually one phase rubbery and the other phase glassy. This combination of rubbery and glassy polymer networks allows an IPN to take on the characteristics of a filler-reinforced elastomeric material, to a leathery material, and to a rubber-reinforced (high impact) plastic material depending on which component becomes the continuous phase. The different morphologies of IPNs depends on a number of factors, including the method of synthesis, compatibility of the polymer systems employed, an on the relative rate of formation of each network.

Embodiments of the present TIM may utilize an IPN matrix that does not demonstrate an intrinsically high thermal conductivity, but may interact with a thermally conductive filler and alter the interfacial phonon scattering in the TIM to improve overall thermal conductivity of the TIM. The TIM may include an IPN matrix having two important features: a flexible segment/branch with end terminations of —OH or —$CF_3$, which may facilitate phase segregation and reduction of the filler material, and a local semi-interpenetrating network (SIPN) structure that enhances phonon transport.

In an embodiment, the TIM may be composed of an IPN matrix of polyurethane (PU) cross-linked with an epoxy (EP) along with conductive fillers. The PU-EP IPN matrix may be formed using conventional techniques known in the art to form a PU-EP IPN matrix. Examples of materials that may be used to form the PU-EP IPN matrix may be found in Table 1.

TABLE 1

Materials

| Designation | Description |
|---|---|
| Polycap | Poly(caprolactone) glycol mol wt = 1978, OH no. = 56.7 |
| TMP | Trimethylpropane |
| 1,4-BD | 1,4-Butanediol |
| MDI | 4,4'-Diphenylmethane diisocyanate |
| MMA | Methyl methacrylate |
| TMPTMA | Trimethylolpropane trimethacrylate |
| BPO | Benzoyl peroxide |
| DGEBA | Bisphenol A diglycidyl ether |
| Imidazole | Imidazole |
| DMP | 2,4,6-tri(dimethylaminomethyl) phenol |

In an embodiment, the PU used in the PU-EP IPN matrix may be prepared by reacting approximately 2 equivalents of the MDI with approximately 0.8 to approximately 1 equivalent of the Polycap at approximately 60° C. A resin kettle, equipped with a nitrogen inlet, stirrer, thermometer, and reflux condenser may be charged with the approximately 2 equivalents of MDI. The approximately 0.8 equivalent to approximately 1 equivalent of the Polycap may be slowly added to the resin kettle under stirring. The ensuing reaction may be carried out under nitrogen at approximately 60° C. until the theoretical isocyanate content (as determined by a di-n-butylamine titration method) is reached, preferably for approximately 40 min, thereby forming a PU prepolymer.

In an embodiment, the EP used in the PU-EP IPN matrix may be composed of poly (methacrylate) (PMMA). The PMMA may be prepared in a resin kettle equipped with a nitrogen inlet, stirrer, thermometer, and reflux condenser. The resin kettle may be immersed in an ice bath. The resin kettle may be charged with approximately 120 g of distilled MMA, approximately 2 g of distilled TMPTMA, and approximately 1 g of BPO. The mixture may be stirred until the BPO is dissolved. The reaction may be continued until approximately 10% to approximately 15% conversion and stopped by rapid cooling, thereby forming an EP prepolymer.

In another embodiment, the EP used may be composed of DGEBA to form a PU-EP IPN matrix having a flexible branch terminated with end —OH or —CF$_3$ moieties. The DGEBA may be prepared in a resin kettle equipped with a nitrogen inlet, stirrer, thermometer, and reflux condenser. The resin kettle may be charged with approximately 120 g of DGEBA. Approximately 3 wt. % of imidazole (relative to the DGEBA) as a catalyst for EP crosslinking and approximately 1 wt. % of DMP (relative to the DGEBA) may be added. The mixture may be stirred until the imidazole and the DMP are dissolved, thereby forming the EP prepolymer.

A conductive filler may be dispersed in the EP prepolymer during stirring. In an embodiment, the mixture may undergo ultrasonficiation for approximately 15 min. Examples of conductive fillers that may be used include Pd-coated Ag, Au-coated Ag, Ag, Ag-coated Cu, spherical Ag powder, carbon fibers, particularly carbon microfibers, and combinations thereof. The conductive filler may also be a combination of electrically conductive metal and thermally conductive/electrically insulative inorganic filler such as BN, AlN, where the filler can be in the form of flakes, powder, hollow spheres, or fibers. The particle size of the filler can be primarily monodisperse or polydisperse phase with varying particle size distribution, shape and morphology. The fillers that have average particle size less than 10 μm and have narrow particle size distribution that assures high packing density are preferred. The Pd or Au are preferably in an amount in the range of 5 to 20 wt % relative to Ag. In a preferred embodiment, BN may be used as the conductive filler in an amount in the range of approximately 20% to approximately 40% by weight relative to the IPN matrix materials. The particle size of the metal filler varies in the range 2-30 μm.

To form the PU-EP IPN matrix, approximately 1 equivalent of the PU prepolymer may be heated to 80° C. and then homogeneously mixed with approximately 1 equivalent of a 1,4-BD/TMP mixture (in approximately 4:1 equivalent ratio) for approximately 2 min to approximately 5 min using a high torque stirrer. Then the EP prepolymer may be added in varying weight ratios and homogeneously mixed for approximately 3 min using the high torque stirrer. Any air entrapped in the mixture may be removed by applying a vacuum. Table 2 provides examples of the varying weight ratios of PU and EP that may be formed.

TABLE 2

PU/EP Ratios

| Cross-linked PU | Cross-linked EP | Type of Polymer |
|---|---|---|
| 85% | 15% | IPN |
| 75% | 25% | IPN |
| 60% | 40% | IPN |
| 50% | 50% | IPN |
| 40% | 60% | IPN |
| 25% | 75% | IPN |
| 15% | 85% | IPN |

The mixture may then be cast in a closed stainless steel mold (with polypropylene lining for easy demolding) at approximately 80° C. to approximately 120° C. for approximately 2 to approximately 16 hr to form the TIM. The TIM may then be used in a thermal interface between two structures, such as a flip-chip, chip-on-chip, or package-on-package, to allow a path for heat dissipation from the high power density circuit devices during operation.

Table 3 provides thermal conductivity (κ) data in W/m-K of an example of a TIM having a 1:1 PU-EP IPN matrix backbone compared to its components and a conventional PU-EP mixture in a 1:1 ratio.

TABLE 3

Thermal Conductivity (κ)

|  | PU | EP | PU-EP (1:1 mixture) | IPN Matrix |
|---|---|---|---|---|
| Without Filler | 0.07 | 0.09 | 0.08 | 0.10 |
| With 30 wt % BN | 0.28 | 0.33 | 0.30 | 0.48 |

As Table 3 illustrates, the components of the IPN matrix, namely the PU and the EP demonstrate innate low thermal conductivities, both individually and when combined in a conventional 1:1 mixture. Accordingly, the thermal conductivity of the PU-EP mixture (0.08 W/m-K) is substantially similar to the thermal conductivity of the individual components (0.07 W/m-K and 0.09 W/m-K respectively). The thermal conductivity of the PU-EP mixture may be considered an average of the two since they are present in a 1:1 ratio. The IPN matrix itself has a low intrinsic thermal conductivity, which is comparable to the PU-EP mixture.

When conductive fillers are included in the mixture, in this example, BN in an amount of 30% by weight relative to the IPN matrix materials, the thermal conductivity increases accordingly. Again, the thermal conductivity of the 1:1 mixture of PU-EP with the thermally conductive filler (0.30 W/m-K) is substantially similar to PU/BN (0.28 W/m-K) and the EP/BN (0.33 W/m-K), and may be considered an average of the two.

However, the IPN matrix, when combined with 30 wt % BN, shows a thermal conductivity (0.48 W/m-K) that is approximately 60% higher than the PU-EP 1:1 mixture with 30 wt % BN (0.30 W/m-k). This increase in thermal conductivity between the PU-EP 1:1 mixture and the IPN matrix is only present when conductive fillers are included, suggesting that the overall increase in thermal conductivity is a result of the interaction between the IPN matrix and the conductive fillers. The IPN matrix may enhance the dispersion/distribution of the conductive fillers as well as phonon scattering throughout the TIM and at the filler/composite interface.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A thermal interface material (TIM) comprising:
   a polymer based composite comprising an inter-penetrating network (IPN) matrix structure, the IPN matrix structure being comprised of a polyurethane and an epoxy in a 1:1 weight ratio, and the IPN matrix structure being fully cross-linked, wherein the IPN matrix structure has a branch terminated with end —$CF_3$ moieties;
   a thermally conductive filler dispersed throughout the IPN matrix structure, the thermally conductive filler including BN in the amount of approximately 20% to approximately 40% by weight; and wherein the polyurethane comprises: approximately 0.8 weight equivalent to approximately 1 weight equivalent of poly(caprolactone) glycol; and approximately 2 weight equivalents of 4,4'-diphenylmenthane diisocyanate.

2. The TIM of claim 1, wherein the epoxy comprises: bisphenol A diglycidyl ether; and
   approximately 1 wt % (relative to the bisphenol A diglycidyl ether) of 2,4,6-tri(dimethylaminomethyl) phenol.

3. The TIM of claim 1, further comprising a cross-linking agent.

4. The TIM of claim 3, wherein the cross-linking agent comprises imidazole.

5. A method of forming a thermal interface material (TIM) comprising:
   forming a polyurethane prepolymer;
   forming an epoxy prepolymer
   mixing the polyurethane prepolymer and the epoxy prepolymer to form a crosslinked inter-penetrating network (IPN); and
   adding a thermally conductive filler,
   wherein the polyurethane prepolymer and the epoxy prepolymer are mixed in a 1:1 weight ratio,
   wherein the IPN is fully crosslinked, wherein the IPN has a branch terminated with end —$CF_3$ moieties,
   wherein the thermally conductive filler includes BN in the amount of approximately 20% to approximately 40% by weight, and wherein the forming the polyurethane prepolymer comprises: charging a resin kettle with approximately 2 weight equivalents of 4,4'-Diphenylmethane diisocyanate; adding approximately 0.8 weight equivalent to approximately 1 weight equivalent of poly(carprolactone) glycol to the resin kettle under stirring; and maintaining a temperature of approximately 60.degree. C. for approximately 40 min.

6. The method of claim 5, wherein the forming the epoxy prepolymer comprises:
   charging the resin kettle with approximately 120 equivalents of bisphenol A diglycidyl ether;
   stirring in approximately 3 wt. % of imidazole relative to the bisphenol A diglycidyl ether and;
   stirring in approximately 1 wt. % of 2,4,6-tri(dimethylaminomethyl) phenol relative to the bisphenol A diglycidyl ether.

7. The method of claim 5, further comprising adding a cross-linking agent to the epoxy prepolymer.

8. The TIM of claim 1, wherein the BN is in the amount of approximately 30% by weight.

9. A thermal interface material (TIM) comprising:
   a polymer based composite comprising an inter-penetrating network (IPN) matrix structure, the IPN matrix structure being comprised of a polyurethane and an epoxy, and the IPN matrix structure being fully cross-linked, wherein the IPN matrix structure has a branch terminated with end —$CF_3$ moieties;
   a thermally conductive filler dispersed throughout the IPN matrix structure, the thermally conductive filler including BN in the amount of approximately 20% to approximately 40% by weight; and wherein the polyurethane comprises: approximately 0.8 weight equivalent to approximately 1 weight equivalent of poly(caprolactone) glycol; and approximately 2 weight equivalents of 4,4'-diphenylmethane diisocyanate.

10. The TIM of claim 9, wherein the BN is in the amount of approximately 30% by weight.

11. The TIM of claim 9, wherein the epoxy comprises: bisphenol A diglycidyl ether; and
    approximately 1 wt % (relative to the bisphenol A diglycidyl ether) of 2,4,6-tri(dimethylaminomethyl) phenol.

* * * * *